(12) United States Patent
Estakhri et al.

(10) Patent No.: US 8,032,694 B2
(45) Date of Patent: *Oct. 4, 2011

(54) DIRECT LOGICAL BLOCK ADDRESSING FLASH MEMORY MASS STORAGE ARCHITECTURE

(75) Inventors: Petro Estakhri, Pleasanton, CA (US); Mahmud Assar, Morgan Hill, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/844,354

(22) Filed: Jul. 27, 2010

(65) Prior Publication Data

US 2010/0293324 A1 Nov. 18, 2010

Related U.S. Application Data

(63) Continuation of application No. 12/426,662, filed on Apr. 20, 2009, now Pat. No. 7,774,576, which is a continuation of application No. 11/165,864, filed on Jun. 24, 2005, now Pat. No. 7,523,249, which is a continuation of application No. 09/850,790, filed on May 7, 2001, now Pat. No. 6,912,618, which is a continuation of application No. 09/521,420, filed on Mar. 8, 2000, now Pat. No. 6,230,234, which is a continuation of application No. 09/311,045, filed on May 13, 1999, now Pat. No. 6,115,785, which is a continuation of application No. 09/087,720, filed on May 29, 1998, now Pat. No. 5,924,113, which is a continuation of application No. 08/509,706, filed on Jul. 31, 1995, now Pat. No. 5,845,313.

(51) Int. Cl.
*G06F 13/00* (2006.01)
*G06F 13/28* (2006.01)
*G06F 9/26* (2006.01)
*G06F 9/34* (2006.01)

(52) U.S. Cl. ........ 711/104; 711/154; 711/202; 711/206; 711/E12.007; 711/E12.058

(58) Field of Classification Search ........................ None
See application file for complete search history.

(56) References Cited

U.S. PATENT DOCUMENTS 4,099,069 A  7/1978 Cricchi et al.
(Continued)

FOREIGN PATENT DOCUMENTS

AU  0 557 723  1/1987
(Continued)

OTHER PUBLICATIONS

Kai Hwang & Faye A. Briggs, *Computer Architecture and Parallel Processing*, McGraw-Hill Book Co., 1984, p. 64.
(Continued)

*Primary Examiner* — Reginald Bragdon
*Assistant Examiner* — Eric S Cardwell
(74) *Attorney, Agent, or Firm* — Leffert Jay & Polglaze, P.A.

(57) ABSTRACT

A nonvolatile semiconductor mass storage system and architecture can be substituted for a rotating hard disk. The system and architecture avoid an erase cycle each time information stored in the mass storage is changed. Erase cycles are avoided by programming an altered data file into an empty mass storage block rather than over itself as a hard disk would. Periodically, the mass storage will need to be cleaned up. These advantages are achieved through the use of several flags, and a map to correlate a logical block address of a block to a physical address of that block. In particular, flags are provided for defective blocks, used blocks, and old versions of a block. An array of volatile memory is addressable according to the logical address and stores the physical address.

25 Claims, 5 Drawing Sheets

U.S. PATENT DOCUMENTS

| | | |
|---|---|---|
| 4,130,900 A | 12/1978 | Watanabe |
| 4,210,959 A | 7/1980 | Wozniak |
| 4,309,627 A | 1/1982 | Tabata |
| 4,355,376 A | 10/1982 | Gould |
| 4,398,248 A | 8/1983 | Hsia et al. |
| 4,405,952 A | 9/1983 | Slakmon |
| 4,414,627 A | 11/1983 | Nakamura |
| 4,450,559 A | 5/1984 | Bond et al. |
| 4,456,971 A | 6/1984 | Fukuda et al. |
| 4,468,730 A | 8/1984 | Dodd et al. |
| 4,473,878 A | 9/1984 | Zolnowsky et al. |
| 4,476,526 A | 10/1984 | Dodd |
| 4,498,146 A | 2/1985 | Martinez |
| 4,525,839 A | 6/1985 | Nozawa et al. |
| 4,532,590 A | 7/1985 | Wallach et al. |
| 4,609,833 A | 9/1986 | Gutterman |
| 4,616,311 A | 10/1986 | Sato |
| 4,654,847 A | 3/1987 | Dutton |
| 4,710,871 A | 12/1987 | Belknap et al. |
| 4,746,998 A | 5/1988 | Robinson et al. |
| 4,748,320 A | 5/1988 | Yorimoto et al. |
| 4,757,474 A | 7/1988 | Fukushi et al. |
| 4,774,700 A | 9/1988 | Satoh et al. |
| 4,780,855 A | 10/1988 | Iida et al. |
| 4,788,665 A | 11/1988 | Fukuda et al. |
| 4,797,543 A | 1/1989 | Watanabe |
| 4,800,520 A | 1/1989 | Iijima |
| 4,829,169 A | 5/1989 | Watanabe |
| 4,843,224 A | 6/1989 | Ohta et al. |
| 4,896,262 A | 1/1990 | Wayama et al. |
| 4,914,529 A | 4/1990 | Bonke |
| 4,920,518 A | 4/1990 | Nakamura et al. |
| 4,924,331 A | 5/1990 | Robinson et al. |
| 4,943,745 A | 7/1990 | Watanabe et al. |
| 4,953,122 A | 8/1990 | Williams |
| 4,970,642 A | 11/1990 | Yamamura |
| 4,970,727 A | 11/1990 | Miyawaki et al. |
| 5,070,474 A | 12/1991 | Tuma et al. |
| 5,093,785 A | 3/1992 | Iijima |
| 5,168,465 A | 12/1992 | Harari |
| 5,198,380 A | 3/1993 | Harari |
| 5,200,959 A | 4/1993 | Gross et al. |
| 5,218,695 A | 6/1993 | Noveck et al. |
| 5,220,518 A | 6/1993 | Haq |
| 5,226,168 A | 7/1993 | Kobayashi et al. |
| 5,227,714 A | 7/1993 | Lou |
| 5,253,351 A | 10/1993 | Yamamoto et al. |
| 5,267,218 A | 11/1993 | Elbert |
| 5,268,318 A | 12/1993 | Harari |
| 5,268,870 A | 12/1993 | Harari |
| 5,270,979 A | 12/1993 | Harari et al. |
| 5,293,560 A | 3/1994 | Harari |
| 5,297,148 A | 3/1994 | Harari et al. |
| 5,303,198 A | 4/1994 | Adachi et al. |
| 5,305,276 A | 4/1994 | Uenoyama |
| 5,305,278 A | 4/1994 | Inoue |
| 5,315,541 A | 5/1994 | Harari et al. |
| 5,315,558 A | 5/1994 | Hag |
| 5,329,491 A | 7/1994 | Brown et al. |
| 5,337,275 A | 8/1994 | Garner |
| 5,341,330 A | 8/1994 | Wells et al. |
| 5,341,339 A | 8/1994 | Wells |
| 5,341,341 A | 8/1994 | Fukuzo |
| 5,353,256 A | 10/1994 | Fandrich et al. |
| 5,357,475 A | 10/1994 | Hasbun et al. |
| 5,359,569 A | 10/1994 | Fujita et al. |
| 5,365,127 A | 11/1994 | Manley |
| 5,369,615 A | 11/1994 | Harari et al. |
| 5,371,702 A | 12/1994 | Nakai et al. |
| 5,381,539 A | 1/1995 | Yanai et al. |
| 5,382,839 A | 1/1995 | Shinohara |
| 5,384,743 A | 1/1995 | Rouy |
| 5,388,083 A | 2/1995 | Assar et al. |
| 5,396,468 A | 3/1995 | Harari et al. |
| 5,404,485 A * | 4/1995 | Ban ............................ 711/202 |
| 5,406,527 A | 4/1995 | Honma |
| 5,418,752 A | 5/1995 | Harari et al. |
| 5,422,842 A | 6/1995 | Cernea et al. |
| 5,422,856 A | 6/1995 | Sasaki et al. |
| 5,428,621 A | 6/1995 | Mehrotra et al. |
| 5,428,758 A * | 6/1995 | Salsburg ...................... 711/165 |
| 5,430,682 A | 7/1995 | Ishikawa et al. |
| 5,430,859 A | 7/1995 | Norman et al. |
| 5,431,330 A | 7/1995 | Wieres |
| 5,434,825 A | 7/1995 | Harari |
| 5,438,573 A | 8/1995 | Mangan et al. |
| 5,465,235 A | 11/1995 | Miyamoto |
| 5,465,338 A | 11/1995 | Clay |
| 5,471,478 A | 11/1995 | Mangan et al. |
| 5,473,765 A | 12/1995 | Gibbons et al. |
| 5,479,638 A | 12/1995 | Assar et al. |
| 5,485,595 A | 1/1996 | Assar et al. |
| 5,490,117 A | 2/1996 | Oda et al. |
| 5,495,442 A | 2/1996 | Cernea et al. |
| 5,504,760 A | 4/1996 | Harari et al. |
| 5,508,971 A | 4/1996 | Cernea et al. |
| 5,513,138 A | 4/1996 | Manabe et al. |
| 5,515,333 A | 5/1996 | Fujita et al. |
| 5,519,847 A | 5/1996 | Fandrich et al. |
| 5,523,980 A | 6/1996 | Sakui et al. |
| 5,524,230 A | 6/1996 | Sakaue et al. |
| 5,530,673 A | 6/1996 | Tobita et al. |
| 5,530,828 A | 6/1996 | Kaki et al. |
| 5,530,938 A | 6/1996 | Akasaka et al. |
| 5,532,962 A | 7/1996 | Auclair et al. |
| 5,532,964 A | 7/1996 | Cernea et al. |
| 5,534,456 A | 7/1996 | Yuan et al. |
| 5,535,328 A | 7/1996 | Harari et al. |
| 5,541,551 A | 7/1996 | Brehner et al. |
| 5,544,118 A | 8/1996 | Harari |
| 5,544,356 A | 8/1996 | Robinson et al. |
| 5,552,698 A | 9/1996 | Tai et al. |
| 5,554,553 A | 9/1996 | Harari |
| 5,563,825 A | 10/1996 | Cernea et al. |
| 5,566,314 A | 10/1996 | DeMarco et al. |
| 5,568,439 A | 10/1996 | Harari |
| 5,572,466 A | 11/1996 | Sukegawa |
| 5,579,502 A | 11/1996 | Konishi et al. |
| 5,581,723 A | 12/1996 | Hasbun et al. |
| 5,583,812 A | 12/1996 | Harari |
| 5,592,415 A | 1/1997 | Kato et al. |
| 5,592,420 A | 1/1997 | Cernea et al. |
| 5,596,526 A | 1/1997 | Assar et al. |
| 5,598,370 A | 1/1997 | Niijima et al. |
| 5,602,987 A | 2/1997 | Harari et al. |
| 5,603,001 A | 2/1997 | Sukegawa et al. |
| 5,606,660 A | 2/1997 | Estakhri et al. |
| 5,611,067 A | 3/1997 | Okamoto et al. |
| 5,640,528 A | 6/1997 | Harney et al. |
| 5,642,312 A | 6/1997 | Harari |
| 5,648,929 A | 7/1997 | Miyamoto |
| 5,663,901 A | 9/1997 | Wallace et al. |
| 5,693,570 A | 12/1997 | Cernea et al. |
| 5,712,819 A | 1/1998 | Harari |
| 5,719,808 A | 2/1998 | Harari et al. |
| 5,723,990 A | 3/1998 | Roohparvar |
| 5,734,567 A | 3/1998 | Griffiths et al. |
| 5,745,418 A | 4/1998 | Ma et al. |
| 5,754,567 A | 5/1998 | Norman |
| 5,757,712 A | 5/1998 | Nagel et al. |
| 5,758,100 A | 5/1998 | Odisho |
| 5,761,117 A | 6/1998 | Uchino et al. |
| 5,768,190 A | 6/1998 | Tanaka et al. |
| 5,768,195 A | 6/1998 | Nakamura et al. |
| 5,773,901 A | 6/1998 | Kantner |
| 5,778,418 A | 7/1998 | Auclair et al. |
| 5,781,478 A | 7/1998 | Takeuchi et al. |
| 5,787,445 A | 7/1998 | Daberko |
| 5,787,484 A | 7/1998 | Norman |
| RE35,881 E | 8/1998 | Barrett et al. |
| 5,799,168 A | 8/1998 | Ban |
| 5,802,551 A | 9/1998 | Komatsu et al. |
| 5,809,515 A | 9/1998 | Kaki et al. |
| 5,809,558 A | 9/1998 | Matthews et al. |
| 5,809,560 A | 9/1998 | Schneider |
| 5,818,350 A | 10/1998 | Estakhri et al. |
| 5,818,781 A | 10/1998 | Estakhri et al. |

| | | |
|---|---|---|
| 5,822,245 A | 10/1998 | Gupta et al. |
| 5,822,252 A | 10/1998 | Lee et al. |
| 5,822,781 A | 10/1998 | Wells et al. |
| 5,831,929 A | 11/1998 | Manning |
| 5,835,935 A | 11/1998 | Estakhri et al. |
| 5,838,614 A | 11/1998 | Estakhri et al. |
| 5,845,313 A | 12/1998 | Estakhri et al. |
| 5,847,552 A | 12/1998 | Brown |
| 5,860,083 A | 1/1999 | Sukegawa |
| 5,860,124 A | 1/1999 | Matthews et al. |
| 5,862,099 A | 1/1999 | Gannage et al. |
| 5,890,192 A | 3/1999 | Lee et al. |
| 5,901,086 A | 5/1999 | Wang et al. |
| 5,907,856 A | 5/1999 | Estakhri et al. |
| 5,909,586 A | 6/1999 | Anderson |
| 5,920,884 A | 7/1999 | Jennings, III et al. |
| 5,924,113 A | 7/1999 | Estakhri et al. |
| 5,928,370 A | 7/1999 | Asnaashari |
| 5,930,815 A | 7/1999 | Estakhri et al. |
| 5,933,368 A | 8/1999 | Ma et al. |
| 5,933,846 A | 8/1999 | Endo |
| 5,936,971 A | 8/1999 | Harari et al. |
| 5,937,425 A | 8/1999 | Ban |
| 5,953,737 A | 9/1999 | Estakhri et al. |
| 5,956,473 A | 9/1999 | Ma et al. |
| 5,959,926 A | 9/1999 | Jones et al. |
| 5,966,727 A | 10/1999 | Nishino |
| 5,986,933 A | 11/1999 | Takeuchi et al. |
| 5,987,563 A | 11/1999 | Itoh et al. |
| 5,987,573 A | 11/1999 | Hiraka |
| 5,991,849 A | 11/1999 | Yamada et al. |
| 6,011,322 A | 1/2000 | Stumfall et al. |
| 6,011,323 A | 1/2000 | Camp |
| 6,018,265 A | 1/2000 | Keshtbod |
| 6,021,408 A | 2/2000 | Ledain et al. |
| 6,026,020 A | 2/2000 | Matsubara et al. |
| 6,026,027 A | 2/2000 | Terrell, II et al. |
| 6,034,897 A | 3/2000 | Estakhri et al. |
| 6,035,357 A | 3/2000 | Sakaki |
| 6,040,997 A | 3/2000 | Estakhri |
| 6,041,001 A | 3/2000 | Estakhri |
| 6,047,352 A | 4/2000 | Lakhani et al. |
| 6,055,184 A | 4/2000 | Acharya et al. |
| 6,055,188 A | 4/2000 | Takeuchi et al. |
| 6,069,827 A | 5/2000 | Sinclair |
| 6,072,796 A | 6/2000 | Christensen et al. |
| 6,076,137 A | 6/2000 | Asnaashari |
| 6,081,447 A | 6/2000 | Lofgren et al. |
| 6,081,878 A | 6/2000 | Estakhri et al. |
| 6,084,483 A | 7/2000 | Keshtbod |
| 6,097,666 A | 8/2000 | Sakui et al. |
| 6,115,785 A | 9/2000 | Estakhri et al. |
| 6,122,195 A | 9/2000 | Estakhri et al. |
| 6,125,424 A | 9/2000 | Komatsu et al. |
| 6,125,435 A | 9/2000 | Estakhri et al. |
| 6,128,695 A | 10/2000 | Estakhri et al. |
| 6,134,145 A | 10/2000 | Wong |
| 6,134,151 A | 10/2000 | Estakhri et al. |
| 6,141,249 A | 10/2000 | Estakhri et al. |
| 6,145,051 A | 11/2000 | Estakhri et al. |
| 6,151,247 A | 11/2000 | Estakhri et al. |
| 6,172,906 B1 | 1/2001 | Estakhri et al. |
| 6,173,362 B1 | 1/2001 | Yoda |
| 6,181,118 B1 | 1/2001 | Meehan et al. |
| 6,182,162 B1 | 1/2001 | Estakhri et al. |
| 6,202,138 B1 | 3/2001 | Estakhri et al. |
| 6,223,308 B1 | 4/2001 | Estakhri et al. |
| 6,226,708 B1 | 5/2001 | McGoldrick et al. |
| 6,230,234 B1 | 5/2001 | Estakhri et al. |
| 6,262,918 B1 | 7/2001 | Estakhri et al. |
| 6,272,610 B1 | 8/2001 | Katayama et al. |
| 6,275,436 B1 | 8/2001 | Tobita et al. |
| 6,279,069 B1 | 8/2001 | Robinson et al. |
| 6,279,114 B1 | 8/2001 | Toombs et al. |
| 6,285,607 B1 | 9/2001 | Sinclair |
| 6,327,639 B1 | 12/2001 | Asnaashari |
| 6,345,367 B1 | 2/2002 | Sinclair |
| 6,374,337 B1 | 4/2002 | Estakhri |
| 6,385,667 B1 | 5/2002 | Estakhri et al. |
| 6,393,513 B2 | 5/2002 | Estakhri et al. |
| 6,397,314 B1 | 5/2002 | Estakhri et al. |
| 6,411,546 B1 | 6/2002 | Estakhri et al. |
| 6,467,021 B1 | 10/2002 | Sinclair |
| 6,490,649 B2 | 12/2002 | Sinclair |
| 6,567,307 B1 | 5/2003 | Estakhri |
| 6,578,127 B1 | 6/2003 | Sinclair |
| 6,587,382 B1 | 7/2003 | Estakhri et al. |
| 6,711,059 B2 | 3/2004 | Sinclair et al. |
| 6,721,819 B2 | 4/2004 | Estakhri et al. |
| 6,721,843 B1 | 4/2004 | Estakhri |
| 6,725,321 B1 | 4/2004 | Sinclair et al. |
| 6,728,851 B1 | 4/2004 | Estakhri et al. |
| 6,751,155 B2 | 6/2004 | Gorobets |
| 6,757,800 B1 | 6/2004 | Estakhri et al. |
| 6,772,274 B1 | 8/2004 | Estakhri |
| 6,813,678 B1 | 11/2004 | Sinclair et al. |
| 6,898,662 B2 | 5/2005 | Gorobets |
| 6,912,618 B2 | 6/2005 | Estakhri et al. |
| 6,950,918 B1 | 9/2005 | Estakhri |
| 6,957,295 B1 | 10/2005 | Estakhri |
| 6,973,519 B1 | 12/2005 | Estakhri et al. |
| 6,978,342 B1 | 12/2005 | Estakhri et al. |
| 7,000,064 B2 | 2/2006 | Payne et al. |
| 2003/0033471 A1 | 2/2003 | Lin et al. |

FOREIGN PATENT DOCUMENTS

| | | |
|---|---|---|
| EP | 0 220 718 A2 | 5/1987 |
| EP | 0 243 503 A1 | 11/1987 |
| EP | 0 392 895 A2 | 10/1990 |
| EP | 0 424 191 A2 | 4/1991 |
| EP | 0 489 204 A1 | 6/1992 |
| EP | 0 522 780 A2 | 1/1993 |
| EP | 0 522 780 B1 | 1/1993 |
| EP | 0 544 252 A2 | 6/1993 |
| EP | 0 613 151 A2 | 8/1994 |
| EP | 0 617 363 A2 | 9/1994 |
| EP | 0 619 541 A2 | 10/1994 |
| EP | 0 663 636 A1 | 7/1995 |
| EP | 0 686 976 A2 | 12/1995 |
| EP | 0 897 579 B1 | 7/2000 |
| EP | 0 891 580 B1 | 11/2000 |
| EP | 0 896 669 B1 | 11/2000 |
| EP | 0 852 766 B1 | 5/2001 |
| EP | 0 852 765 B1 | 9/2001 |
| EP | 0 722 585 B1 | 5/2002 |
| EP | 0 910 826 B1 | 6/2002 |
| EP | 0 691 008 B1 | 11/2002 |
| EP | 0 861 468 B1 | 4/2003 |
| EP | 0 978 040 B1 | 5/2004 |
| EP | 1 157 328 B1 | 5/2005 |
| FR | 93 01908 | 8/1993 |
| GB | 2 251 323 A | 7/1992 |
| GB | 2 291 990 A | 2/1996 |
| GB | 2 297 637 A | 7/1996 |
| GB | 2 304 428 A | 3/1997 |
| GB | 2 348 991 | 12/2002 |
| GB | 2 351 822 | 1/2003 |
| GB | 2 384 337 | 7/2003 |
| GB | 2 384 883 | 10/2005 |
| GB | 2 384 338 | 11/2005 |
| GB | 2 384 072 | 12/2005 |
| GB | 2 411 499 | 2/2006 |
| IS | 117881 | 5/2003 |
| JP | 59-45695 | 9/1982 |
| JP | 58-21594 | 12/1983 |
| JP | 58-215795 | 12/1983 |
| JP | 59-092483 | 5/1984 |
| JP | 59-162695 | 9/1984 |
| JP | 60-212900 | 10/1985 |
| JP | 61-96598 | 5/1986 |
| JP | 62-283496 | 12/1987 |
| JP | 62-283497 | 12/1987 |
| JP | 63-183700 | 7/1988 |
| JP | 1-138694 | 5/1989 |
| JP | 3-228377 | 10/1991 |
| JP | 4-057295 | 2/1992 |
| JP | 4-254994 | 9/1992 |
| JP | 4-268284 | 9/1992 |

| | | |
|---|---|---|
| JP | 4-278297 | 10/1992 |
| JP | 4-332999 | 11/1992 |
| JP | 5-128877 | 5/1993 |
| JP | 5-282883 | 10/1993 |
| JP | 6-004399 | 1/1994 |
| JP | 6-036578 | 2/1994 |
| JP | 6-124175 | 5/1994 |
| JP | 6-124231 | 5/1994 |
| JP | 6-131889 | 5/1994 |
| JP | 6-132747 | 5/1994 |
| JP | 6-149395 | 5/1994 |
| JP | 6-266596 | 9/1994 |
| JP | 7-084871 | 3/1995 |
| JP | 7-093499 | 4/1995 |
| JP | 7-114499 | 5/1995 |
| JP | 7-141258 | 6/1995 |
| JP | 7-235193 | 9/1995 |
| JP | 7-311708 | 11/1995 |
| JP | 7-334996 | 12/1995 |
| JP | 8-018018 | 1/1996 |
| JP | 8-069696 | 3/1996 |
| JP | 9-147581 | 6/1997 |
| SU | 1388877 | 4/1988 |
| SU | 1408439 | 7/1988 |
| SU | 1515164 | 10/1989 |
| SU | 1541619 | 2/1990 |
| SU | 1573458 | 6/1990 |
| SU | 1686449 | 10/1991 |
| WO | WO 84/00628 | 2/1984 |
| WO | WO 94/20906 | 9/1994 |

OTHER PUBLICATIONS

Walter Lahti and Dean McCarron, "State of the Art: Magnetic VS Optical Store Data in a Flash", *Byte Magazine*, Nov. 1, 1990. 311, vol. 15, No. 12.

Ron Wilson, Technology Updates, Integrated Circuits, "I-Mbit flash memories seek their role in system design", *Computer Design 28* (Mar. 1, 1989), No. 5, Tulsa OK, US, pp. 30 and 32.

S. Mehoura et al., SunDisk Corporation, Santa Clara, CA. R.W. Gregor et al., AT&T Bell Laboratories, Allentown, PA. 1992 Symposium of VLSJ Circuits Digest of Technical Papers, "EEPROM for Solid State Disk Applications", pp. 24 and 25.

Mendel Rosenblum and John K. Ousterhout, "The Design and Implementation of a Log-Structured File System," 1991, 15 pgs., Berkeley, USA.

Brian Dipert and Markus Levy, *Designing with Flash Memory*, Annabooks, Apr. 1994, 445 pgs.

Science Forum, Inc. "Flash Memory Symposium '95", 1995, 13 pgs. Tokyo.

Ross S. Finlayson and David R. Cheriton, "An Extended File Service Exploiting Write-Once Storage," *ACM Symposium on Operating Systems Principles*, 1987, 10 pgs.

Jason Gait, "The Optical File Cabinet: A Random-Access File System for Write-Once Storage", *Computer*, Jun. 1988, 12 pgs.

Henry G. Baker, *Memory Management*, 1995, Springer-Verlag Heidelberg, Germany, 19 pgs.

Sape J. Mullender and Andrew S. Tanenbaum, "A Distributed File Service Based on Optimistic Concurrency Control", *ACM Press*, 1985, 12 pgs. New York, New York.

Hiroshi Nakamura, Junichi Miyamoto, Kenichi Imamiya and Yoshihisa Iwata, "A Novel Sense Amplifier for Flexible Voltage Operation NAND Flash Memories", VLSI Circuits, 1995, *Digest of Technical Papers*, 2 pgs.

Hiroshi Nakamura, Junichi Miyamoto, Kenichi Imamiya, Yoshihisa Iwata and Hideko Oodaira, "A Novel Sensing Scheme with On-Chip Page Copy for Flexible Voltage NAND Flash Memories", *IEICE Transactions on Electronics*, vol. E79-C, No. 6, pp. 836-844.

Takaaki Nozaki, Toshiaki Tanaka, Yoshiro Kijiya, Eita Kinoshita, Tatsuo Tsuchiya and Yutaka Hayashi, "A 1-Mb EEPROM with MONOS Memory Cell for Semiconductor Disk Application", *Journal of Solid-State Circuits*, vol. 26, No. 4, 5 pgs.

Kai Hwang and Faye A. Briggs, *Computer Architecture and Parallel Processing*, 1984, McGraw-Hill, Inc.

Ron Wilson, "Integrated Circuits; 1-Mb flash memories seek their role in system design", Mar. 1, 1989, 2 pgs. Tulsa, OK.

S. Mehroura, J.H. Yuan, R.A. Cemea, W.Y. Chien, D.C. Guteman, G. Samachisa, R.D. Norman, M. Mofidi, W. Lee, Y. Fong, A. Mihnea, E. Hann, R.W. Gregor, E.P. Eberhardt, J.R. Radosevich, K.R. Stiles, R.A. Kohler, C.W. Leung, and T.J. Mulrooney, "Serial 9Mb F EEPROM for Solid State Disk Applications", symposium, 2 pgs., 1992, Mountain View, CA.

Steven H. Leibson, "Nonvolatile, In-Circuit-Reprogrammable Memories", *EDN Special Report*, Jan. 3, 1991, No. 12, 12 pgs.

Walter Lahti and Dean McCarron, "State of the Art: Magnetic vs. Optical Store Data in a Flash", *Byte Magazine*, 1990, vol. 15, No. 12, 7 pgs.

Ramon Caceres, Fred Douglis, Kai Li and Brian Marsh, "Operating System Implications of Solid-State Mobile Computers", *Workshop on Workstation Operating Systems*, Oct. 1993, pp. 21-27.

Michael Wu and Wily Zwaenepoel, "A Non-Volatile, Main Memory Storage System", *ACM Press*, 1994, 12 pgs., San Jose, CA.

Dave Bursky, "Innovative flash memories match DRAM densities: available with a choice of features, flash memories are finding homes in many systems (including related articles on the origins of flash, and on the differences between NAND and NOR flash memories)", *Electronic Design*, May 16, 1994, vol. 42, No. 10, 9 pgs.

Anthony Cataldo, "New flash enhancements up ante. (Intel's 28F400BV-120 and 28F004BV-120, Atmel's AT29BV010 and AT29BV020, and Samsung Semiconductor's KM29V3200 flash memory devices)" (product announcement), *Electronic News*, Mar. 13, 1995, vol. 41, No. 2056, 4 pgs.

Sam Weber, "Flash modules' portability, reusability, small size valued for a host of APPs-Consumer formats flocking to flash", *Electronic Engineering Times*, Jul. 22, 1996, No. 911, 9 pgs.

Stan Baker, "But Integration Calls for Hardware, Software Changes: Flash designers face the dawn of a new memory age", *Electronic Engineering Times*, Dec. 3, 1990, vol. 41, No. 619, 5 pgs.

Toshiba, MOS Memory (Non-Volatile), 1995, Data Book.

Toshiba, Toshiba MOS Digital Integrated Circuit Silicon Gate CMOS, (TC58NS512DC), Mar. 21, 2001, 43 pgs., Data Book.

Toshiba, Toshiba Corporation, SMIL (Smartmedia Interface Library) Hardware Edition Version 1.00, Jul. 1, 2000, 136 pgs., Data Book.

Toshiba, Toshiba MOS Digital Integrated Circuit Silicon Gate, (TC58512FT), Mar. 5, 2001, 43 pgs., Data Book.

Toshiba, Toshiba MOS Digital Integrated Circuit Silicon Gate, (TC58DVM92A1FT00), Jan. 10, 2003, 44 pgs., Data Book.

Toshiba, Toshiba MOS Digital Integrated Circuit Silicon Gate, (TC58DVG02A1FT00), Jan. 10, 2003, 44 pgs., Data Book.

Toshiba, Toshiba MOS Digital Integrated Circuit Silicon Gate, (TC58100FT), Mar. 5, 2001, 43 pgs., Data Book.

Toshiba, MOS Memory (Non-Volatile), 1996, 279 pgs., Data Book.

"Fifth Biennial Nonvolatile Memory Technology Review," 1993 Conference, Jun. 22-24, 1993, Linthicum Heights, MD, USA.

Dan Auclair, "Optimal Solid State Disk Architecture for Portable Computers", Silicon Valley PC Design Conference, Jul. 9-10, 1991, pp. 811-815.

* cited by examiner

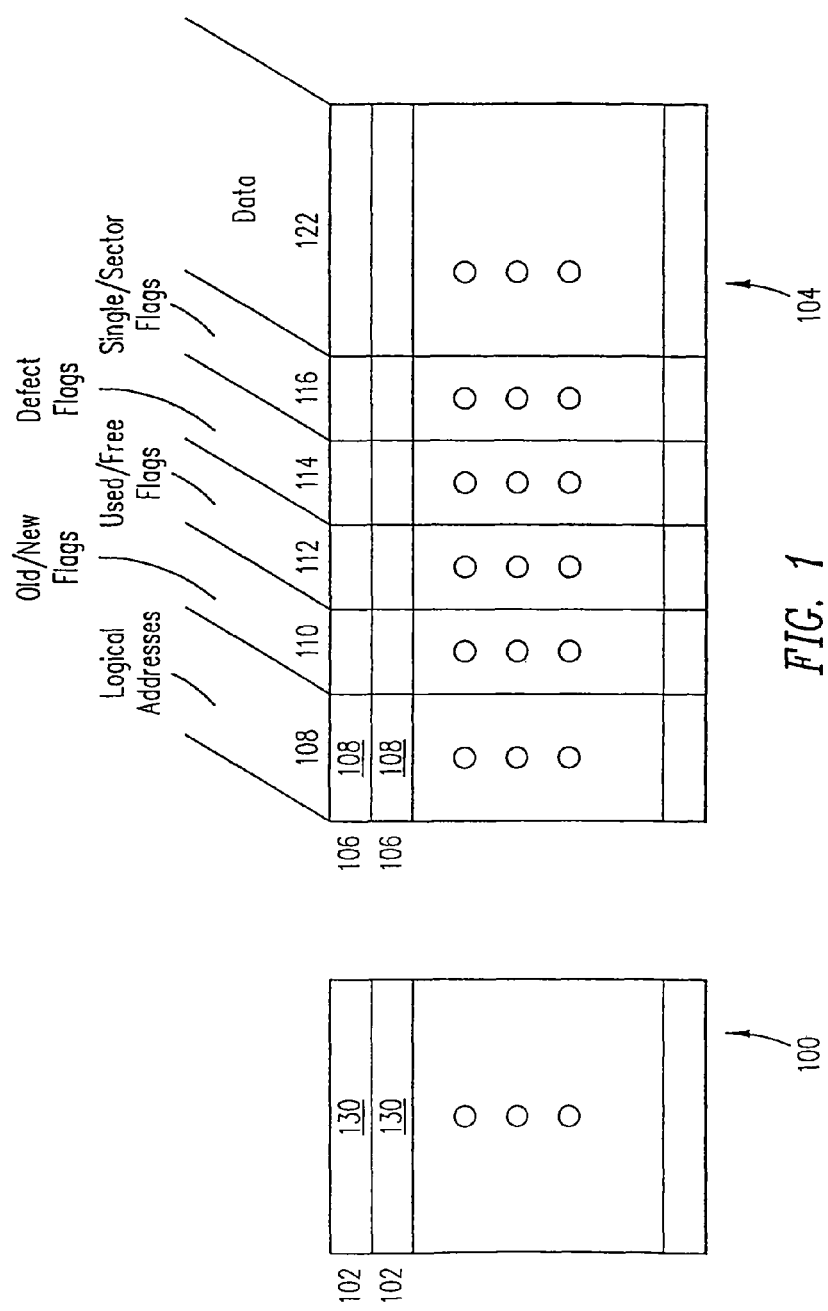

| Actual LBA/ Actual PBA | Virtual PBA | old | used | def |
|---|---|---|---|---|
| 0 | | 0 | 0 | 0 |
| 1 | | 0 | 0 | 0 |
| 2 | | 0 | 0 | 0 |
| 3 | | 0 | 0 | 0 |
| 4 | | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

FIG. 4

| Actual LBA/ Actual PBA | Virtual PBA | old | used | def |
|---|---|---|---|---|
| 0 | | 0 | 1 | 0 |
| 1 | | 0 | 0 | 0 |
| 2 | | 0 | 0 | 0 |
| 3 | 0 | 0 | 0 | 0 |
| 4 | | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

FIG. 5

| Actual LBA/ Actual PBA | Virtual PBA | old | used | def |
|---|---|---|---|---|
| 0 | | 0 | 1 | 0 |
| 1 | | 0 | 1 | 0 |
| 2 | | 0 | 0 | 0 |
| 3 | 0 | 0 | 0 | 0 |
| 4 | 1 | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

FIG. 6

| Actual LBA/ Actual PBA | Virtual PBA | old | used | def |
|---|---|---|---|---|
| 0 | | 1 | 1 | 0 |
| 1 | | 0 | 1 | 0 |
| 2 | | 0 | 1 | 0 |
| 3 | 2 | 0 | 0 | 0 |
| 4 | 1 | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 7*

| Actual LBA/ Actual PBA | Virtual PBA | old | used | def |
|---|---|---|---|---|
| 0 | | 1 | 1 | 0 |
| 1 | | 1 | 1 | 0 |
| 2 | | 0 | 1 | 0 |
| 3 | 2 | 0 | 1 | 0 |
| 4 | 3 | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 8*

DIRECT LOGICAL BLOCK ADDRESSING FLASH MEMORY MASS STORAGE ARCHITECTURE

CROSS REFERENCE TO RELATED APPLICATIONS

This application is a continuation of U.S. patent application Ser. No. 12/426,662, (allowed) filed on Apr. 20, 2009 U.S. Pat. No. 7,774,576, issued on Aug. 10, 2010, and entitled "DIRECT LOGICAL BLOCK ADDRESSING FLASH MEMORY MASS STORAGE ARCHITECTURE," which is a continuation of U.S. application Ser. No. 11/165,864 filed Jun. 24, 2005 now U.S. Pat. No. 7,523,249, issued on Apr. 21, 2009, and entitled "DIRECT LOGICAL BLOCK ADDRESSING FLASH MEMORY MASS STORAGE ARCHITECTURE," which is a continuation of U.S. application Ser. No. 09/850,790 filed May 7, 2001 now U.S. Pat. No. 6,912,618, issued on Jun. 28, 2005 and entitled: "DIRECT LOGICAL BLOCK ADDRESSING FLASH MEMORY MASS STORAGE ARCHITECTURE," which is a continuation of U.S. application Ser. No. 09/521,420 filed Mar. 8, 2000 now U.S. Pat. No. 6,230,234, issued on May 8, 2001 and entitled "DIRECT LOGICAL BLOCK ADDRESSING FLASH MEMORY MASS STORAGE ARCHITECTURE," which is a continuation of U.S. application Ser. No. 09/311,045 filed May 13, 1999 now U.S. Pat. No. 6,115,785, issued on Sep. 5, 2000 and entitled "DIRECT LOGICAL BLOCK ADDRESSING FLASH MEMORY MASS STORAGE ARCHITECTURE," which is a continuation of prior U.S. application Ser. No. 09/087,720 filed May 29, 1998 now U.S. Pat. No. 5,924,113 issued on Jul. 13, 1999, entitled "DIRECT LOGICAL BLOCK ADDRESSING FLASH MEMORY MASS STORAGE ARCHITECTURE," which is a continuation of U.S. application Ser. No. 08/509,706 filed Jul. 31, 1995 now U.S. Pat. No. 5,845,313, issued on Dec. 1, 1998, entitled "DIRECT LOGICAL BLOCK ADDRESSING FLASH MEMORY MASS STORAGE ARCHITECTURE."

FIELD OF THE INVENTION

This invention relates to the field of mass storage for computers. More particularly, this invention relates to an architecture for replacing a hard disk with a semiconductor non-volatile memory and in particular flash memory.

BACKGROUND OF THE INVENTION

Computers conventionally use rotating magnetic media for mass storage of documents, data, programs and information. Though widely used and commonly accepted, such hard disk drives suffer from a variety of deficiencies. Because of the rotation of the disk, there is an inherent latency in extracting information from a hard disk drive.

Other problems are especially dramatic in portable computers. In particular, hard disks are unable to withstand many of the kinds of physical shock that a portable computer will likely sustain. Further, the motor for rotating the disk consumes significant amounts of power decreasing the battery life for portable computers.

Solid state memory is an ideal choice for replacing a hard disk drive for mass storage because it can resolve the problems cited above. Potential solutions have been proposed for replacing a hard disk drive with a semiconductor memory. For such a system to be truly useful, the memory must be non-volatile and alterable. The inventors have determined that FLASH memory is preferred for such a replacement.

FLASH memory is a transistor memory cell which is programmable through hot electron, source injection, or tunneling, and erasable through Fowler-Nordheim tunneling. The programming and erasing of such a memory cell requires current to pass through the dielectric surrounding a floating gate electrode. Because of this, such types of memory have a finite number of erase-write cycles. Eventually, the dielectric deteriorates. Manufacturers of FLASH cell devices specify the limit for the number of erase-write cycles between 100,000 and 1,000,000.

One requirement for a semiconductor mass storage device to be successful is that its use in lieu of a rotating media hard disk mass storage device be transparent to the designer and the user of a system using such a device. In other words, the designer or user of a computer incorporating such a semiconductor mass storage device could simply remove the hard disk and replace it with a semiconductor mass storage device. All presently available commercial software should operate on a system employing such a semiconductor mass storage device without the necessity of any modification.

SunDisk proposed an architecture for a semiconductor mass storage using FLASH memory at the Silicon Valley PC Design Conference on Jul. 9, 1991. That mass storage system included read-write block sizes of 512 Bytes to conform with commercial hard disk sector sizes.

Earlier designs incorporated erase-before-write architectures. In this process, in order to update a file on the media, if the physical location on the media was previously programmed, it has to be erased before the new data can be reprogrammed.

This process would have a major deterioration on overall system throughput. When a host writes a new data file to the storage media, it provides a logical block address to the peripheral storage device associated with this data file. The storage device then translates this given logical block address to an actual physical block address on the media and performs the write operation. In magnetic hard disk drives, the new data can be written over the previous old data with no modification to the media. Therefore, once the physical block address is calculated from the given logical block address by the controller, it will simply write the data file into that location. In solid state storage, if the location associated with the calculated, physical block address was previously programmed, before this block can be reprogrammed with the new data, it has to be erased. In one previous art, in erase-before-write architecture where the correlation between logical block address given by the host is one to one mapping with physical block address on the media. This method has many deficiencies. First, it introduces a delay in performance due to the erase operation before reprogramming the altered information. In solid state flash, erase is a very slow process.

Secondly, hard disk users typically store two types of information, one is rarely modified and another which is frequently changed. For example, a commercial spread sheet or word processing software program stored on a user's system are rarely, if ever, changed. However, the spread sheet data files or word processing documents are frequently changed. Thus, different sectors of a hard disk typically have dramatically different usage in terms of the number of times the information stored thereon is changed. While this disparity has no impact on a hard disk because of its insensitivity to data changes, in a FLASH memory device, this variance can cause sections of the mass storage to wear out and be unusable significantly sooner than other sections of the mass storage.

In another architecture, the inventors previously proposed a solution to store a table correlating the logical block address to the physical block address. The inventions relating to that solution are disclosed in U.S. Pat. No. 5,388,083, issued on Feb. 7, 1995. U.S. Pat. No. 5,479,638 issued on Dec. 26, 1995. Those applications are incorporated herein by reference.

The inventors' previous solution discloses two primary algorithms and an associated hardware architecture for a semiconductor mass storage device. It will be understood that "data file" in this patent document refers to any computer file including commercial software, a user program, word processing software document, spread sheet file and the like. The first algorithm in the previous solution provides means for avoiding an erase operation when writing a modified data file back onto the mass storage device. Instead, no erase is performed and the modified data file is written onto an empty portion of the mass storage.

The semiconductor mass storage architecture has blocks sized to conform with commercial hard disk sector sizes. The blocks are individually erasable. In one embodiment, the semiconductor mass storage can be substituted for a rotating hard disk with no impact to the user, so that such a substitution will be transparent. Means are provided for avoiding the erase-before-write cycle each time information stored in the mass storage is changed.

According to the first algorithm, erase cycles are avoided by programming an altered data file into an empty block. This would ordinarily not be possible when using conventional mass storage because the central processor and commercial software available in conventional computer systems are not configured to track continually changing physical locations of data files. The previous solution includes a programmable map to maintain a correlation between the logical address and the physical address of the updated information files.

All the flags, and the table correlating the logical block address to the physical block address are maintained within an array of CAM cells. The use of the CAM cells provides very rapid determination of the physical address desired within the mass storage, generally within one or two clock cycles. Unfortunately, as is well known, CAM cells require multiple transistors, typically six. Accordingly, an integrated circuit built for a particular size memory using CAM storage for the tables and flags will need to be significantly larger than a circuit using other means for just storing the memory.

The inventors proposed another solution to this problem which is disclosed in U.S. Pat. No. 5,485,595, issued on Jan. 16, 1996. That application is incorporated herein by reference.

This additional previous solution invented by these same inventors is also for a nonvolatile memory storage device. The device is also configured to avoid having to perform an erase-before-write each time a data file is changed by keeping a correlation between logical block address and physical block address in a volatile space management RAM. Further, this invention avoids the overhead associated with CAM cell approaches which require additional circuitry.

Like the solutions disclosed above by these same inventors, the device includes circuitry for performing the two primary algorithms and an associated hardware architecture for a semiconductor mass storage device. In addition, the CAM cell is avoided in this previous solution by using RAM cells.

Reading is performed in this previous solution by providing the logical block address to the memory storage. The system sequentially compares the stored logical block addresses until it finds a match. That data file is then coupled to the digital system. Accordingly, the performance offered by this solution suffers because potentially all of the memory locations must be searched and compared to the desired logical block address before the physical location of the desired information can be determined.

What is needed is a semiconductor hard disk architecture which provides rapid access to stored data without the excessive overhead of CAM cell storage.

BRIEF DESCRIPTION OF THE DRAWINGS

FIG. 1 shows a schematic block diagram of an architecture for a semiconductor mass storage according to the present invention.

FIG. 2 shows an alternative embodiment to the physical block address 102 of the RAM storage of FIG. 1.

FIGS. 4 through 8 show the status of several of the flags and information for achieving the advantages of the present invention.

DETAILED DESCRIPTION OF THE PREFERRED EMBODIMENT

Figure 3:
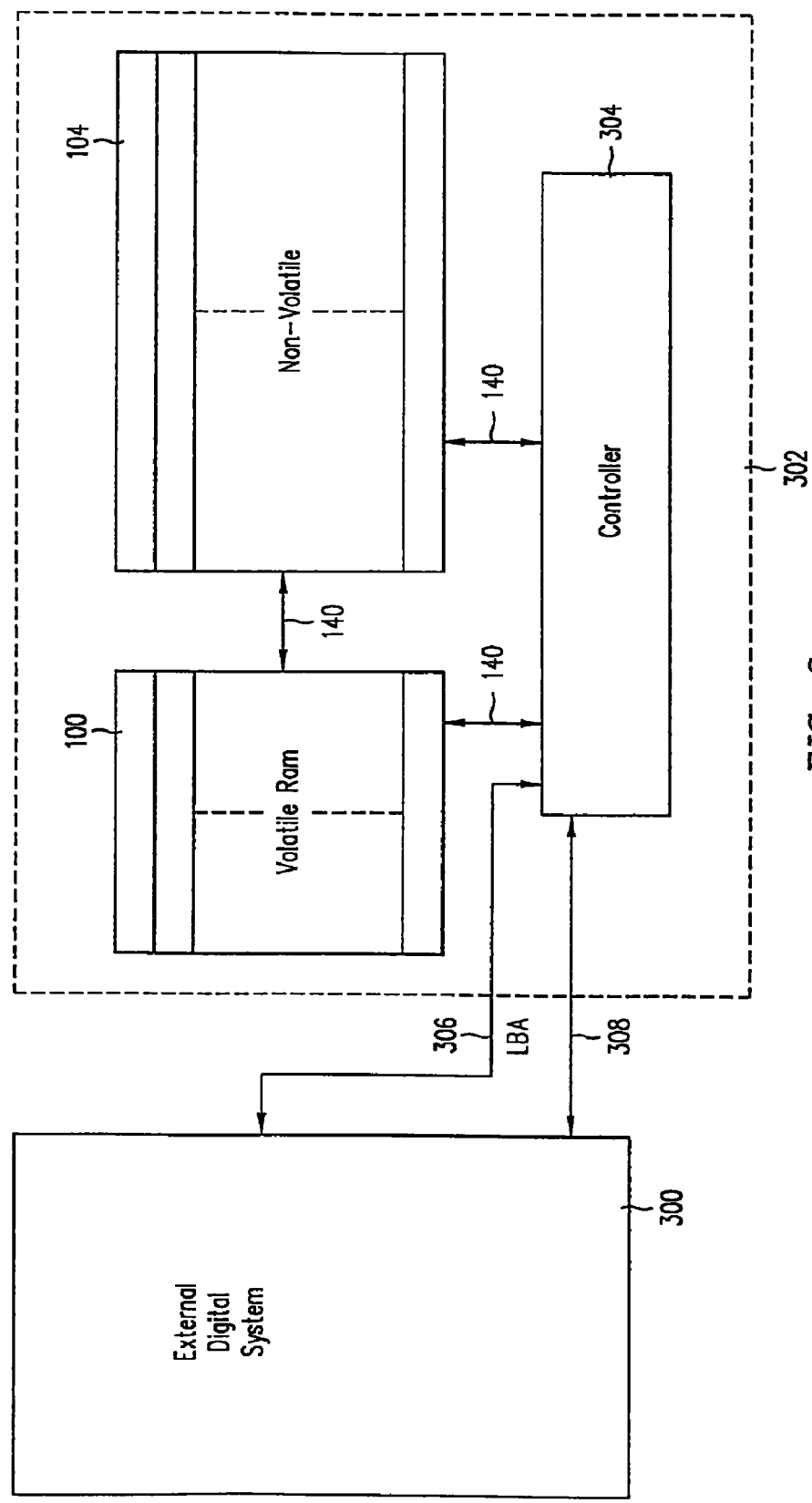
FIG. 3 shows a block diagram of a system incorporating the mass storage device of the present invention.

FIG. 1 shows an architecture for implementation of a solid state storage media according to the present invention. The storage media is for use with a host or other external digital system. The mass storage is partitioned into two portions, a volatile RAM array 100 and a nonvolatile array 104. According to the preferred embodiment, all of the nonvolatile memory storage is FLASH. The FLASH may be replaced by EEPROM. The RAM can be of any convenient type.

The memory storage 104 is arranged into N blocks of data from zero through N−1. Each of the blocks of data is M Bytes long. In the preferred embodiment, each data block is 512 Bytes long to correspond with a sector length in a commercially available hard disk drive plus the extra numbers of bytes to store the flags and logical block address information and the associated ECC. The memory 104 can contain as much memory storage as a user desires. An example of a mass storage device might include 100 M Byte of addressable storage. There are a plurality of RAM locations 102.

Each RAM location 102 is uniquely addressable by a controller using an appropriate one of the logical block addresses provided by the host system or the actual physical address of the nonvolatile media. The RAM location 102 contains the physical block address of the data associated with the logical block address and the flags associated with a physical block address on the nonvolatile media.

It is possible that the physical block address can be split into two fields as shown in FIG. 2. These fields can be used for cluster addresses of a group of data blocks. The first such field 290 is used to select a cluster address and the second such field 292 can be used to select the start address of the logical block address associated with this cluster.

A collection of information flags is also stored for each nonvolatile memory location 106. These flags include an old/new flag 110, a used/free flag 112, a defect flag, 114, and a single/sector flag 116. Additionally, there is also a data store 122.

When writing data to the mass storage device of the present invention, a controller determines the first available physical block for storing the data. The RAM location 102 corresponding to the logical block address selected by the host is written with the physical block address where the data is actually stored within the nonvolatile memory array in 104 (FIG. 1).

Assume for example that a user is preparing a word processing document and instructs the computer to save the document. The document will be stored in the mass storage system. The host system will assign it a logical block address. The mass storage system of the present invention will select a physical address of an unused block or blocks in the mass storage for storing the document. The address of the physical block address will be stored into the RAM location 102 corresponding to the logical block address. As the data is programmed, the system of the present invention also sets the used/free flag 112 in 104 and 293 to indicate that this block location is used. One used/free flag 112 is provided for each entry of the nonvolatile array 104.

Later, assume the user retrieves the document, makes a change and again instructs the computer to store the document. To avoid an erase-before-write cycle, the system of the present invention provides means for locating a block having its used/free flag 112 in 100 unset (not programmed) which indicates that the associated block is erased. The system then sets the used/free flag for the new block 112 of 106 and 293 of 100 and then stores the modified document in that new physical block location 106 in the nonvolatile array 104. The address of the new physical block location is also stored into the RAM location 102 corresponding to the logical block address, thereby writing over the previous physical block location in 102. Next, the system sets the old/new flag 110 of the previous version of the document indicating that this is an old unneeded version of the document in 110 of 104 and 293 of 100 In this way, the system of the present invention avoids the overhead of an erase cycle which is required in the erase-before-write of conventional systems to store a modified version of a previous document.

Because of RAM array 100 will lose its memory upon a power down condition, the logical block address with the active physical block address in the media is also stored as a shadow memory 108 in the nonvolatile array 104. It will be understood the shadow information will be stored into the appropriate RAM locations 102 by the controller. During power up sequence, the RAM locations in 100 are appropriately updated from every physical locations in 104, by reading the information 106 of 104. The logical address 108 of 106 is used to address the RAM location of 100 to update the actual physical block address associated with the given logical block address. Also since 106 is the actual physical block address associated with the new data 122, the flags 110, 112, 114, and 116 are updated in 293 of 102 with the physical block address of 106 in 100. It will be apparent to one of ordinary skill in the art that the flags can be stored in either the appropriate nonvolatile memory location 106 or in both the nonvolatile memory location and also in the RAM location 102 associated with the physical block address.

During power up, in order to assign the most recent physical block address assigned to a logical block address in the volatile memory 100, the controller will first reads the Flags 110,112,114, and 116 portion of the nonvolatile memory 104 and updates the flags portion 293 in the volatile memory 100. Then it reads the logical block address 108 of every physical block address of the nonvolatile media 104 and by tracking the flags of the given physical block address in the volatile memory 100, and the read logical block address of the physical block address in the nonvolatile memory 104, it can update the most recent physical block address assigned to the read logical block address in the volatile memory 100.

FIG. 3 shows a block diagram of a system incorporating the mass storage device of the present invention. An external digital system 300 such as a host computer, personal computer and the like is coupled to the mass storage device 302 of the present invention. A logical block address is coupled via an address bus 306 to the volatile RAM array 100 and to a controller circuit 304. Control signals are also coupled to the controller 304 via a control bus 308. The volatile RAM array 100 is coupled via data paths 140 for providing the physical block address to the nonvolatile RAM array 104. The controller 304 is coupled to control both the volatile RAM 100, the nonvolatile array 104, and for the generation of all flags.

A simplified example, showing the operation of the write operation according to the present invention is shown in FIGS. 4 through 8. Not all the information flags are shown to avoid obscuring these features of the invention in excessive detail. The data entries are shown using decimal numbers to further simplify the understanding of the invention. It will be apparent to one of ordinary skill in the art that in a preferred embodiment binary counting will be used.

FIG. 4 shows an eleven entry mass storage device according to the present invention. There is no valid nor usable data stored in the mass storage device of FIG. 4. Accordingly, all the physical block addresses are empty. The data stored in the nonvolatile mass storage location '6' is filled and old. Additionally, location '9' is defective and cannot be used.

The host directs the mass storage device of the example to write data pursuant to the logical block address '3' and then to '4' The mass storage device will first write the data associated with the logical block address '3'. The device determines which is the first unused location in the nonvolatile memory. In this example, the first empty location is location '0'. Accordingly, FIG. 5 shows that for the logical block address '3', the corresponding physical block address '0' is stored and the used flag is set in physical block address '0'. The next empty location is location '1'. FIG. 6 shows that for the logical block address '4', the corresponding physical block address '1' is stored and the used flag is set in physical block address '1'.

The host instructs that something is to be written to logical block address '3' again. The next empty location is determined to be location '2'. FIG. 7 shows that the old flag in location '0' is set to indicate that this data is no longer usable, the used flag is set in location '2' and the physical block address in location '3' is changed to '2'.

Next, the host instructs that something is to be written to logical block address '4' again. The next empty location is determined to be location '3'. FIG. 8 shows that the old flag in location '1' is set to indicate that this data is no longer usable, the used flag is set in location '3' and the physical block address in location '4' is changed to '3'. (Recall that there is generally no relation between the physical block address and the data stored in the same location.)

Figure 9:
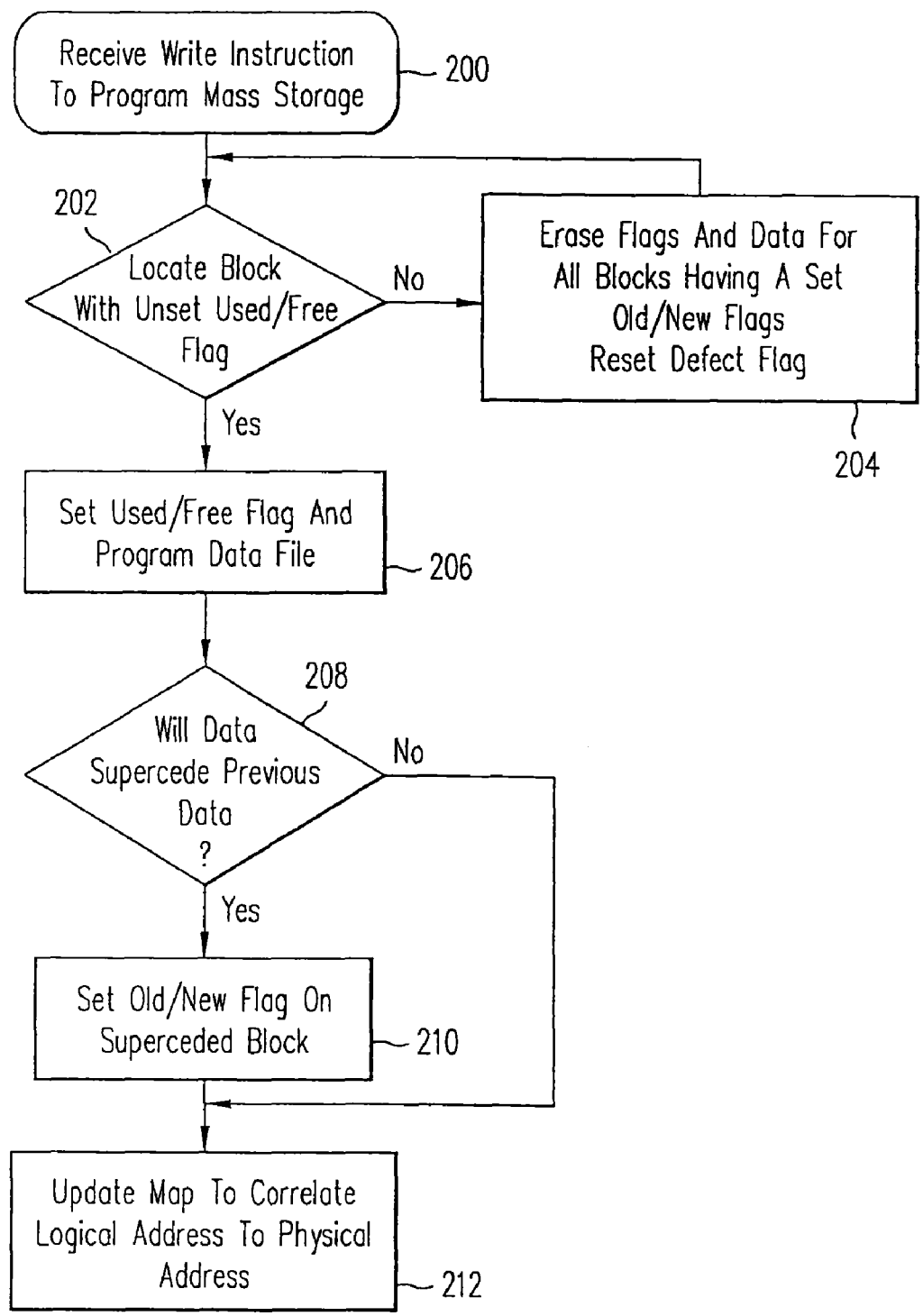
FIG. 9 shows a flow chart block diagram of the first algorithm according to the present invention.

FIG. 9 shows algorithm 1 according to the present invention. When the system of the present invention receives an instruction to program data into the mass storage (step 200), then the system attempts to locate a free block (step 202), i.e., a block having an unset (not programmed) used/free flag. If successful, the system sets the used/free flag for that block and programs the data into that block (step 206).

If on the other hand, the system is unable to locate a block having an unset used/free flag, the system erases the flags (used/free and old/new) and data for all blocks having a set old/new flag and unset defect flag (step 204) and then searches for a block having an unset used/free flag (step 202). Such a block has just been formed by step 204. The system then sets the used/flag for that block and programs the data file into that block (step 206).

If the data is a modified version of a previously existing file, the system must prevent the superseded version from being accessed. The system determines whether the data file supersedes a previous data file (step 208). If so, the system sets the old/new flag associated with the superseded block (step 210). If on the other hand, the data file to be stored is a newly created data file, the step of setting the old/new flag (step 210) is skipped because there is no superseded block. Lastly, the map for correlating the logical address 108 to the physical address 130 is updated (step 212).

By Following the procedure outlined above, the overhead associated with an erase cycle is avoided for each write to the memory 104 except for periodically. This vastly improves the performance of the overall computer system employing the architecture of the present invention.

In the preferred embodiment of the present invention, the programming of the flash memory follows the procedure commonly understood by those of ordinary skill in the art. In other words, the program impulses are appropriately applied to the bits to be programmed and then compared to the data being programmed to ensure that proper programming has occurred. In the event that a bit fails to be erased or programmed properly, a defect flag 114 (in FIG. 1) is set which prevent that block from being used again.

The present invention is described relative to a preferred embodiment. Modifications or improvements which are apparent to one of ordinary skill in the art after reading this disclosure are deemed within the spirit and scope of this invention.

What is claimed is:

1. A method comprising:
attempting to locate a free location in memory;
if a free location in the memory is located, storing a data file in the located location, setting a first flag associated with the located location, and updating a map correlating a logical address associated with the data file to a physical address associated with the located location; and
if a free location in memory is not located, erasing a data file stored in a used location in the memory having a set second flag associated therewith;
wherein updating the map comprises storing the physical address of the located location without storing the corresponding logical address associated with the data file.

2. The method of claim 1, wherein attempting to locate a free location in memory comprises attempting to locate a first free location in memory.

3. The method of claim 1, wherein the first flag comprises a used/free flag.

4. The method of claim 1, wherein the second flag comprises an old/new flag.

5. The method of claim 1, wherein a free location in the memory comprises a free block of a nonvolatile memory and wherein a used location in the memory comprises a used block of the nonvolatile memory.

6. The method of claim 5, wherein if a free location in the memory is located and if the data file being stored in a block of the nonvolatile memory supersedes a previous data file, further comprising setting a second flag associated with a block of the nonvolatile memory in which the previous data file is stored.

7. The method of claim 6, wherein setting a second flag associated with a block of the nonvolatile memory in which the previous data file is stored comprises setting a flag in the block of the nonvolatile memory in which the previous data file is stored.

8. The method of claim 5, wherein attempting to locate a free block of the nonvolatile memory comprises attempting to locate a block of the nonvolatile memory having an unset first flag associated therewith.

9. The method of claim 5, wherein attempting to locate a free block of the nonvolatile memory is performed responsive to receiving an instruction to store the data file.

10. The method of claim 5, wherein erasing a data file stored in a used block of the nonvolatile memory comprises erasing data files stored in a plurality of used blocks of the nonvolatile memory.

11. The method of claim 5, wherein each of the blocks of nonvolatile memory comprise a respective individually erasable portion of a nonvolatile storage device.

12. The method of claim 5, wherein erasing a data file stored in a used block of the nonvolatile memory further comprises erasing the set second flag associated therewith.

13. The method of claim 12, wherein erasing a data file stored in a used block of the nonvolatile memory further comprises erasing a first flag associated therewith.

14. The method of claim 1, wherein the memory comprises nonvolatile memory and if a free location in the memory is located, further comprising storing the map in a location in volatile memory.

15. The method of claim 14, wherein the first flag associated with the located location is stored in the located location.

16. The method of claim 14, wherein the first flag associated with the located location is stored in the location in volatile memory.

17. The method of claim 14, wherein setting a second flag associated with a block of the nonvolatile memory in which the previous data file is stored comprises setting a flag in a location in volatile memory.

18. A method comprising:
attempting to locate a free location in memory;
if a free location in the memory is located, storing a data file in the located location, setting a first flag associated with the located location, and updating a logical to physical address map with a physical address of the located location; and
if a free location in memory is not located, erasing a data file stored in a used location in the memory having a set second flag associated therewith;
wherein updating the logical to physical address map comprises storing the physical address without storing a logical address corresponding to the stored physical address.

19. The method of claim 18, wherein storing the physical address without storing the logical address further comprises storing the physical address in a location in volatile memory corresponding to the logical address.

20. A method comprising:
reading a flag associated with a location in nonvolatile memory;
reading a logical address associated with the location in the nonvolatile memory; and
storing a physical address associated with the location in the nonvolatile memory in a location in volatile memory associated with the read logical address responsive to the read flag;
wherein the physical address is stored in the location in volatile memory without storing the read logical address in the location in volatile memory.

21. The method of claim 20, wherein the reading and storing acts are performed responsive to a power up sequence.

22. The method of claim 21, wherein performing the reading and storing acts responsive to a power up sequence comprises performing the reading and storing acts during the power up sequence.

23. The method of claim 20, wherein the reading and storing acts are performed in response to a power down condition.

24. The method of claim 20, further comprising addressing the location in the volatile memory using the read logical address.

25. The method of claim 20, further comprising storing the read flag in the location in the volatile memory associated with the read logical address.

* * * * *